(12) United States Patent
Wollitzer (10) Patent No.: US 7,042,236 B1
(45) Date of Patent: May 9, 2006

(54) MEASURING PROBE FOR MEASURING HIGH FREQUENCIES

(75) Inventor: Michael Wollitzer, Fridolfing (DE)

(73) Assignee: Rosenberger Hochfrequenztechnik GmbH & Co., Fridolfing (DE)

( * ) Notice: Subject to any disclaimer, the term of this patent is extended or adjusted under 35 U.S.C. 154(b) by 158 days.

(21) Appl. No.: 10/088,591

(22) PCT Filed: Sep. 18, 2000

(86) PCT No.: PCT/DE00/03231

§ 371 (c)(1),
(2), (4) Date: Jul. 29, 2002

(87) PCT Pub. No.: WO01/22097

PCT Pub. Date: Mar. 29, 2001

(30) Foreign Application Priority Data

Sep. 21, 1999 (DE) ................................ 199 45 178

(51) Int. Cl.
*G01R 31/02* (2006.01)

(52) U.S. Cl. ........................................ 324/754

(58) Field of Classification Search ............... 324/751, 324/752, 753, 754, 758, 158.1, 757, 761, 324/762, 765
See application file for complete search history.

(56) References Cited

U.S. PATENT DOCUMENTS

| 4,697,143 A | | 9/1987 | Lockwood et al. | |
| 4,871,964 A | * | 10/1989 | Boll et al. | 324/754 |
| 4,894,612 A | | 1/1990 | Drake et al. | |
| 5,373,231 A | * | 12/1994 | Boll et al. | 324/158.1 |
| 5,506,515 A | * | 4/1996 | Godshalk et al. | 324/762 |
| 5,512,838 A | * | 4/1996 | Roach | 324/754 |
| 5,565,788 A | * | 10/1996 | Burr et al. | 324/762 |
| 6,118,287 A | * | 9/2000 | Boll et al. | 324/754 |
| 6,181,150 B1 | * | 1/2001 | Okuno | 324/762 |

* cited by examiner

*Primary Examiner*—Vinh Nguyen
*Assistant Examiner*—Tung X. Nguyen
(74) *Attorney, Agent, or Firm*—Lowe, Hauptman & Berner, LLP (57) ABSTRACT

The invention relates to a measuring probe (100) for measuring high frequencies, comprising a contact end (20) for contacting planar structures and a coaxial-cable end (18) for connecting to a coaxial cable (22), whereby a coplanar conductor structure (10) consisting of at least two conductors (12, 14) is located between the contact end (20) and the coaxial-cable end (18). A dielectric (28) which supports the coplanar conductor structure (10) is provided on at least one side, in particular both sides of the coplanar conductor structure (10) which extends over a predetermined section between the coaxial-cable end (18) and the contact end (20). Between the dielectric (28) and the contact end (20), the measuring probe (100) is configured in such a way, that the conductors (12, 14) of the coplanar conductor structure (10) are held freely in space and are mounted in an elastic manner in relation to the supporting dielectric (28).

12 Claims, 5 Drawing Sheets

MEASURING PROBE FOR MEASURING HIGH FREQUENCIES

RELATED APPLICATION DATA

The application is a 371 of PCT/DE00/03231 filed on Sep. 18, 2000.

FIELD OF INVENTION

The invention relates to a measuring probe for measuring high frequencies.

BACKGROUND ART

To test electronic circuits produced on wafers, for example for their ability to operate and their electrical characteristics, use is usually made of measuring probes which are applied mechanically to appropriate contact points on the electronic circuit to be tested. Electronic circuits of this kind which need to be tested are increasingly circuits which generate or process high-frequency signals, which means that for the measuring probe there is an impedance of which due note needs to be taken. In other words, the measuring probe needs to have an impedance matched to the contact with the electrical circuit to be tested as otherwise, if there are mismatches, there will, as is generally known, be corresponding reflections which will have an unwanted effect on any measurement made or will make measurement totally impossible. There should not even be any change in impedance over the measuring probe itself because changes in impedance of this kind also cause corresponding points of reflection.

Hence there is known from U.S. Pat. No. 4,697,143 a measuring probe which, to allow a constant impedance to be obtained from a measuring cable to a contact point, has a co-planar conductor structure, with a signal conductor and a ground conductor being spaced away from one another in such as a way as to produce a desired constant impedance. However, this arrangement has the disadvantage that, due to the use of an aluminium oxide substrate, complicated shielding is required to avoid higher-order modes. Also, the measuring probe is complicated, laborious and cost-intensive to produce. Because of the relevant tolerances, not every measuring probe produced meets the preset parameters and for this reason there is a high scrap rate in production, which makes the measuring probe even more expensive. In addition, the totally rigid arrangement of the co-planar conductor structure having three or more conductors means there is a problem in making contact. This is because, given the dimensions that exist on wafers and the corresponding tolerances to which the measuring probe, the contact points and the mechanical alignment of the measuring probe are subject, it is virtually impossible mechanically for all the conductors in the measuring probe's co-planar conductor structure to be precisely in the plane of the contact points when the probe is applied to the points. Hence certain conductors contact their particular contact point better and others contact theirs less satisfactorily or not at all.

From U.S. Pat. No. 4,894,612 is known a measuring probe in which a dielectric is arranged over a complete length of a co-planar conductor structure. What is further disclosed is a measuring probe having strip lines where ends of the strip lines stand out resiliently from a substrate acting as a mounting.

The object of the invention is therefore to provide an improved measuring probe of the above kind, with simple and inexpensive volume production being achieved in this case with, at the same time, contact of a good standard.

SUMMARY OF THE INVENTION

One aspect of the present invention relates to a measuring probe for measuring high frequencies that includes a contact for contacting planar structures and a co-axial cable end for connection to a co-axial cable. A co-planar conductor structure having at least two conductors is arranged between the contact end and the co-axial cable end. A solid dielectric mounts the co-planar conductor structure. The dielectric is arranged on the co-planar conductor structure and on at least one side of the co-planar conductor structure in a central section of the probe so the dielectric is between and spaced from the co-axial cable end and the contact end. Each conductor in the co-planar conductor structure includes a portion formed to be individually free in space and resilient in relation to the dielectric. A respective gap is formed between each pair of conductors in the co-planar conductor structure from the co-axial cable end to the contact end in such a way that a constant characteristic impedance is obtained from the co-axial cable end to the contact end.

A measuring probe with the foregoing features is relatively inexpensive and accurate even though it can be produced in high volume. The probe impedance can be controlled, so there are low reflections when contact is made with the planar structure for measuring purposes. The arrangement according to the invention is notable for operating frequencies of up to 40 to 60 GHz, with impedance being substantially free of dispersion, i.e. independent of the operating frequency, over the whole of the co-planar conductor structure due to the design according to the invention. The freely resilient arrangement of the conductors in the co-planar conductor structure between the dielectric and the co-axial cable end ensures a high standard of contact between all the conductors in the co-planar conductor structure and the corresponding contact points on a device to be tested. The standard of the contact is not affected by the measuring probe being tilted when the probe is applied to the contact points.

Another aspect of the invention concerns apparatus for coupling an electromagnetic wave between first co-planar, spaced planar electrical conductors and a pair of spaced co-axial electrical conductors. The apparatus comprises N second co-planar, planar conductors having first and second ends respectively adapted to be connected to the first conductors and the co-axial conductors, where N is an integer greater than one. The second N conductors are transversely spaced from each other throughout the length thereof between the first and second ends. The transverse spacing between the second N conductors is different in different portions of the length thereof between the first and second ends. A solid dielectric is electromagnetically coupled with the portions of the second conductors that have the greatest transverse spacing from each other. The solid dielectric and the transverse spacing are such that a constant characteristic impedance is obtained between the first and second ends.

The solid dielectric and the portions of the second conductors having the greatest transverse spacing are preferably located remotely from the first and second ends.

Preferably, the apparatus is a contact probe and the portions of the second conductors having the greatest transverse separation and the solid dielectric are fixedly connected, with portions of the second conductors between the portion having the greatest separation and the first end being individually free in space and resilient in relation to the solid dielectric so that the second conductors at the first end form contact fingers that are relatively free in space to contact against ends of the first conductors.

Preferably, N is 3 and a central one of the second conductors is adapted to be connected to the center conductor of the co-axial conductors, and an outer pair of the second conductors is adapted to be connected to the outer conductor of the co-axial conductors.

In one embodiment, the transverse spacing between the second conductors in the vicinity of the first end of the second conductors is tapered, preferably such that the spacing is less at the first end than at a location of the second conductors longitudinally spaced from the first end.

In another embodiment, the tapering is constant between the first end and the portions of the second conductors having the greatest separation. The dielectric is preferably metallised over its full area on a side thereof remote from the face of the dielectric that contacts the co-planar conductor structure.

In a preferred embodiment, the dielectric is in the form of at least one block of quartz.

To provide a secure connection between the co-planar conductor structure and the block of dielectric, the dielectric block has on its side that it is connected to the co-planar structure, a metal coating which substantially coincides in shape with the co-planar structure.

To suppress higher-order modes above the desired operating frequency the dielectric is metallised over its full area on a side remote from the co-planar conductor structure. This also produces a closed, shielded structure in the vicinity of the dielectric.

For certain applications, a planar circuit, preferably an electrical or electronic active circuit or at least one active circuit element, is arranged at the co-axial cable end. This puts the additional circuit or the additional circuit element in the immediate vicinity of contacts between the measuring probe and a circuit to be tested at the contact end of the measuring probe.

The invention will be explained in detail below by reference to the drawings.

BRIEF DESCRIPTION OF THE DRAWING

DETAILED DESCRIPTION OF THE DRAWING

Figure 1:
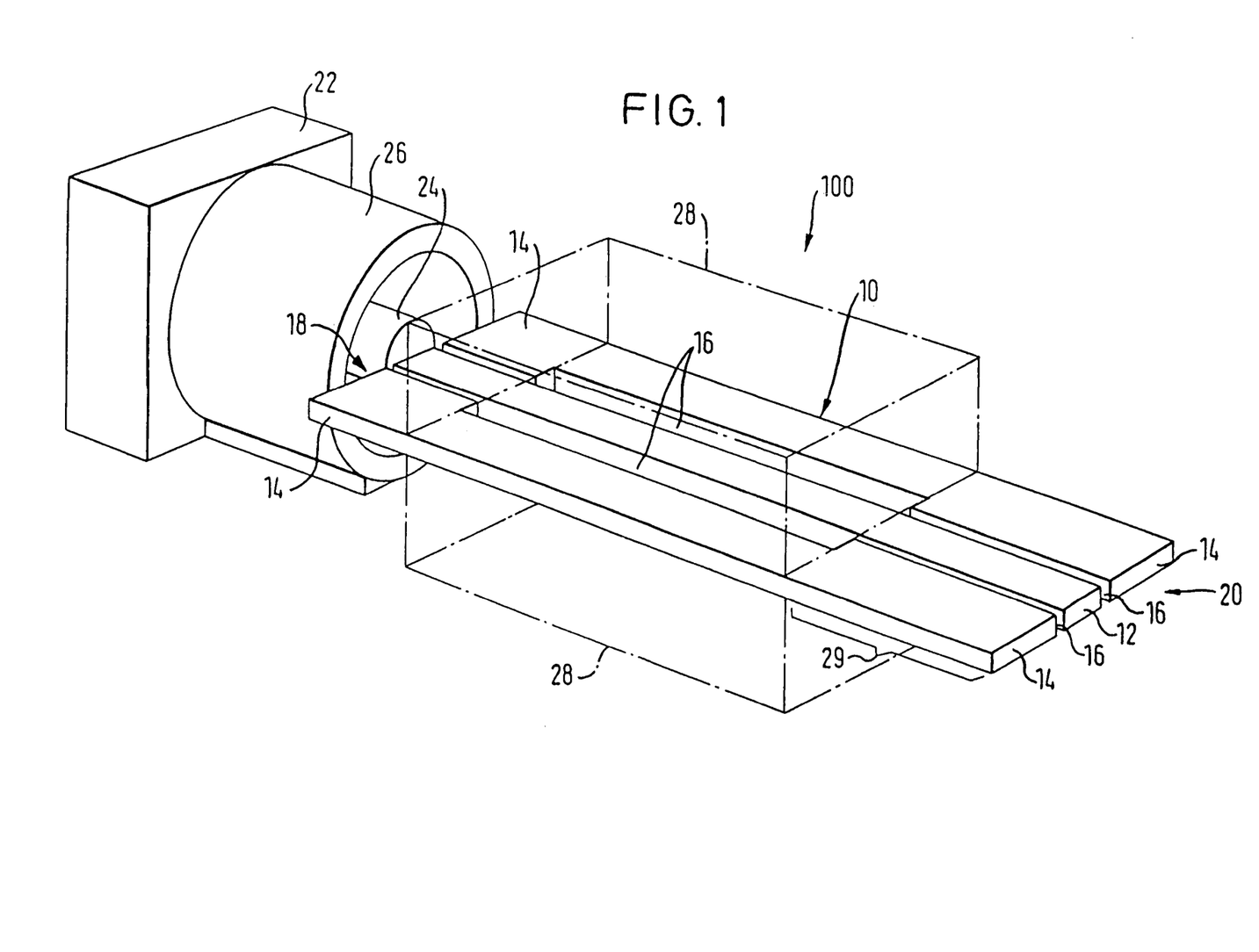
FIG. 1 is a perspective view of a first preferred embodiment of a measuring probe according to the invention.

The first preferred embodiment of a measuring probe 100 according to the invention which is shown in FIG. 1 comprises a co-planar conductor structure 10 having a signal conductor 12 in the centre and two ground conductors 14 arranged in co-planar positions adjacent to the signal conductor 12. A predetermined gap 16 is formed between signal conductor 12 and a given ground conductor 14. The co-planar conductor structure 10 extends from a co-axial cable end 18 to a contact end 20 and the gap 16 is formed over the entire length of the co-planar conductor structure 10 in such a way as to produce a constant predetermined characteristic impedance. At the co-axial cable end 18, the co-planar conductor structure 18 is connected to a co-axial cable 22, with the signal conductor 12 making contact with a centre conductor 24 and the ground conductors 14 with an outer conductor 26 of the co-axial cable.

In a method of the above kind, provision is made in accordance with the invention for the conductors of the co-planar conductor structure to be produced by a lithographic electrofabrication process This has the advantage that a measuring probe of small dimensions with a precisely predetermined characteristic impedance which thus shows low reflection of high frequencies and hence has a high bandwidth can be produced in a simple, inexpensive and, for volume production, repeatable manner.

For volume production, at least one and in particular more than one co-planar conductor structure is produced on a silicon wafer by a photolithographic process.

Mechanical strength for the conductors of a co-planar wave-transmitting line up to the time of final assembly without any complicated lining-up of the conductors is achieved by producing the co-planar conductor structure by the lithographic electrofabrication process in such a way that the conductors are connected together at one end.

In a preferred embodiment, the method comprises the following steps:

(a) vapour deposition of a layer of metal on a silicon wafer, (b) application of a light-sensitive resist, (c) exposure of the light-sensitive resist through a mask which is substantially a negative of the structure of at least one co-planar conductor structure to be produced, (d) developing the resist to give a structure having depressions corresponding to the structure of the co-planar conductor structures to be produced, (e) filling the depressions with an electrically conductive material by electroplating, (f) removing the layer of metal and detaching the co-planar conductor structure from the wafer, (g) connecting individual co-planar conductor structures on one or both sides to a carrier member between the co-axial cable end and the contact end and (h) connecting the co-planar conductor structure to the co-axial cable.

The layer of metal in step (a) comprises for example titanium, silver, chromium and/or gold and as one option the electrically conductive material in step (e) may be nickel. The carrier member in step (g) is for example a dielectric and in particular a block of quartz. Advantageously, the co-planar wave-transmitting line and the carrier member or members are also mounted in a housing in a subsequent step. In the region of the quartz block this produces a tunnel giving all-round shielding.

To cause the conductors in the co-planar conductor structure to be fixed in position in a suitable manner, in steps (a) to (e) each co-planar conductor structure is produced with a bridge which connects all the conductors in a co-planar conductor structure together, particularly at the co-axial cable end. This bridge is advantageously removed after the fitting of the carrier member or members or before the connection to the co-axial cable.

For even greater strength, the bridge also comprises a frame which surrounds the co-planar conductor structure.

The invention will be explained in detail below by reference to the drawings. In the drawings:

FIG. 3 is a plan view of a third preferred embodiment of a measuring probe according to the invention, FIGS. 4 to 7 show successive steps in a method according to the invention.

The first preferred embodiment of a measuring probe 100 according to the invention which is shown in FIG. 1 comprises a co-planar conductor structure 10 having a signal conductor 12 in the centre and two ground conductors 14 arranged in co-planar positions adjacent to the signal conductor 12. A predetermined gap 16 is formed between signal conductor 12 and a given ground conductor 14. The co-planar conductor structure 10 extends from a co-axial cable end 18 to a contact end 20 and the gap 16 is formed over the entire length of the co-planar conductor structure 10 in such a way as to produce a constant predetermined characteristic impedance. At the co-axial cable end 18, the co-planar conductor structure 18 is connected to a co-axial cable 22, with the signal conductor 12 making contact with a centre conductor 24 and the ground conductors 14 with an outer conductor 26 of the co-axial cable.

In a central section between the co-axial cable end 18 and the contact end 20, there is arranged on the two sides of the co-planar conductor structure 10 a dielectric in the form of respective blocks of quartz 28. The two quartz blocks 28 and the co-planar conductor structure 10 are placed one on top of the other in a sandwich-like structure. The quartz blocks 28 are securely connected to the co-planar conductor structure 10 and is each carry on their side adjacent the co-planar conductor structure 10 metallising which substantially matches the shape of the co-planar conductor structure 10 in the region of the quartz blocks 28. What is obtained in this way is a particularly firm and close connection between the quartz blocks 28 and the conductors 12, 14 of the co-planar conductor structure 10. Because of the electromagnetic relationship with the dielectric 28, the gap 16 is widened in the region of the quartz blocks 28 thus giving, overall, a constant characteristic impedance over the entire co-planar conductor structure 10 from the co-axial cable end 18 to the contact end. The respective metallisings on the two quartz blocks 28 are advantageously connected together electrically by means of a suitable fitting technique. This gives a ground plane which is identical for both sides of the quartz blocks and a corresponding identical shielding action.

As is immediately evident from FIG. 1, conductors 12, 14 are arranged to be free in space in a region 29 between the quartz blocks 28 acting as mountings and the contact end 20, thus allowing each conductor to be individually resilient relative to its mounting in the quartz blocks 28. If the contact end 20 of the measuring probe 100 is now pressed mechanically against appropriate contact points for an electrical circuit to be tested, the opportunity which each individual conductor 12, 14 in the co-planar conductor structure 10 has to be individually resilient means that each individual conductor 12, 14 is in optimum contact with the particular contact point assigned to it. Any tilting of the measuring probe 100 when pressed against the contact points mechanically and any tolerances to which either the conductors 12, 14 themselves or the surfaces of the contact points are subject are compensated for by the resilient movement of the individual conductors 12, 14. As a result of this, a defined contact which is always the same is obtained whenever conductors 12, 14 are applied mechanically to corresponding contact points, thus making it possible for optimum measurements to be made with the measuring probe 100 according to the invention.

It is merely by way of example that measuring probe 100 is shown with three conductors 12, 14 in a ground-signal-ground or g-s-g layout. Co-planar conductor structures having only two conductors 12, 14 or more than three conductors 12, 14 are of course also possible, with the signal and ground conductors laid out as follows: g-s-g-s-g-s-g . . . or g-s-g-g-s-g-g-s-g-g . . . or the like. In this way it becomes possible for electrical circuits for testing to be contacted with a single measuring probe which has a plurality of co-planar signal lines.

Figure 2:
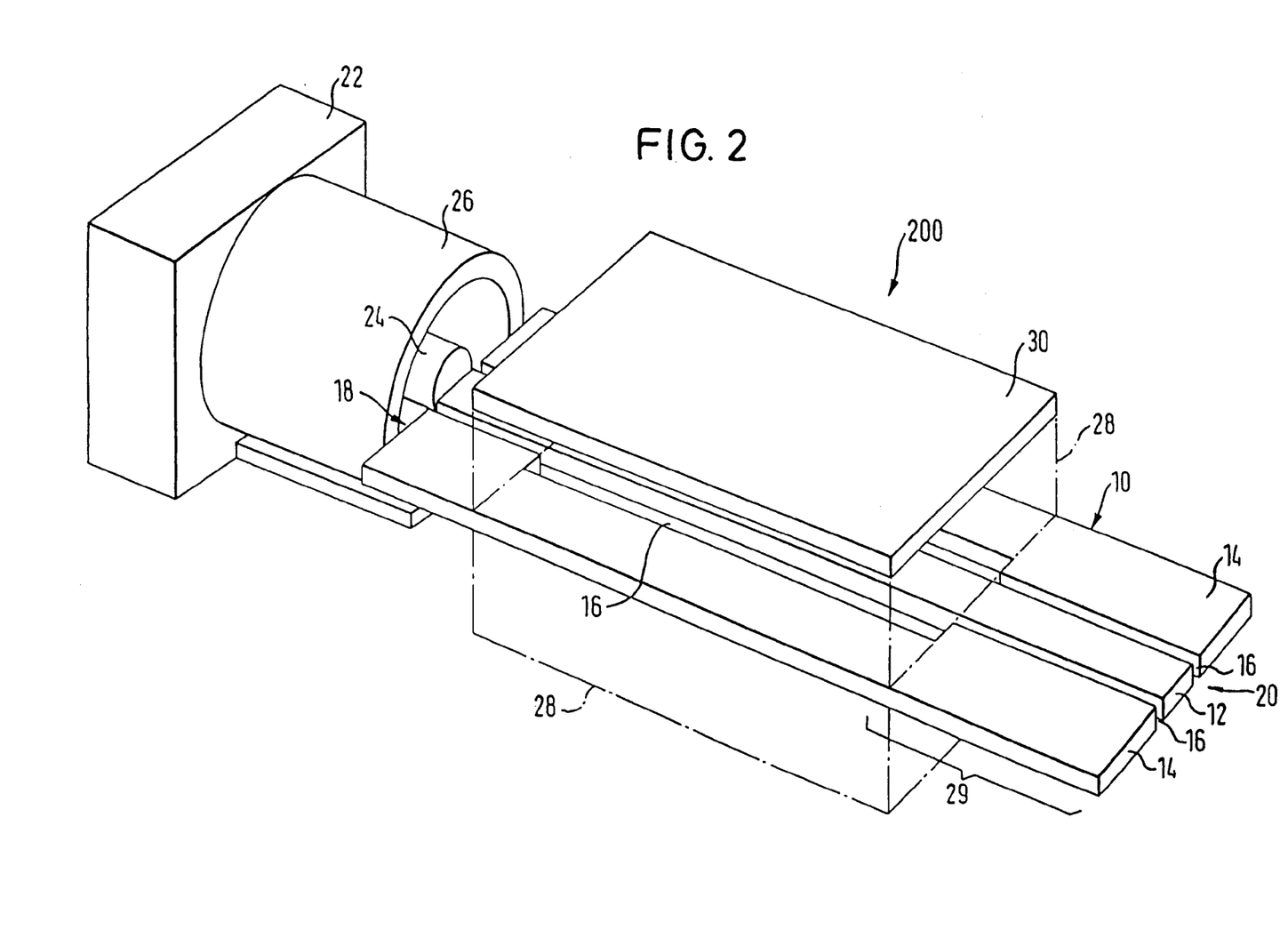
FIG. 2 is a perspective view of a second preferred embodiment of a measuring probe according to the invention.

The second preferred embodiment of a measuring probe 200 according to the invention, which is shown in FIG. 2, is substantially the same as that shown in FIG. 1 and the same parts are identified by the same reference numerals, thus allowing the reader to be referred to the explanations given above in relation to FIG. 1 for descriptions of such parts. In contrast to embodiment 100, the quartz blocks 28 have full-area metallising 30 on a side remote from the co-planar conductor structure 10. In the first place this metallising causes unwanted higher-order modes above the desired operating frequency to be suppressed and at the same time it produces a closed system over a predetermined region of the co-planar conductor structure 10.

Figure 3:
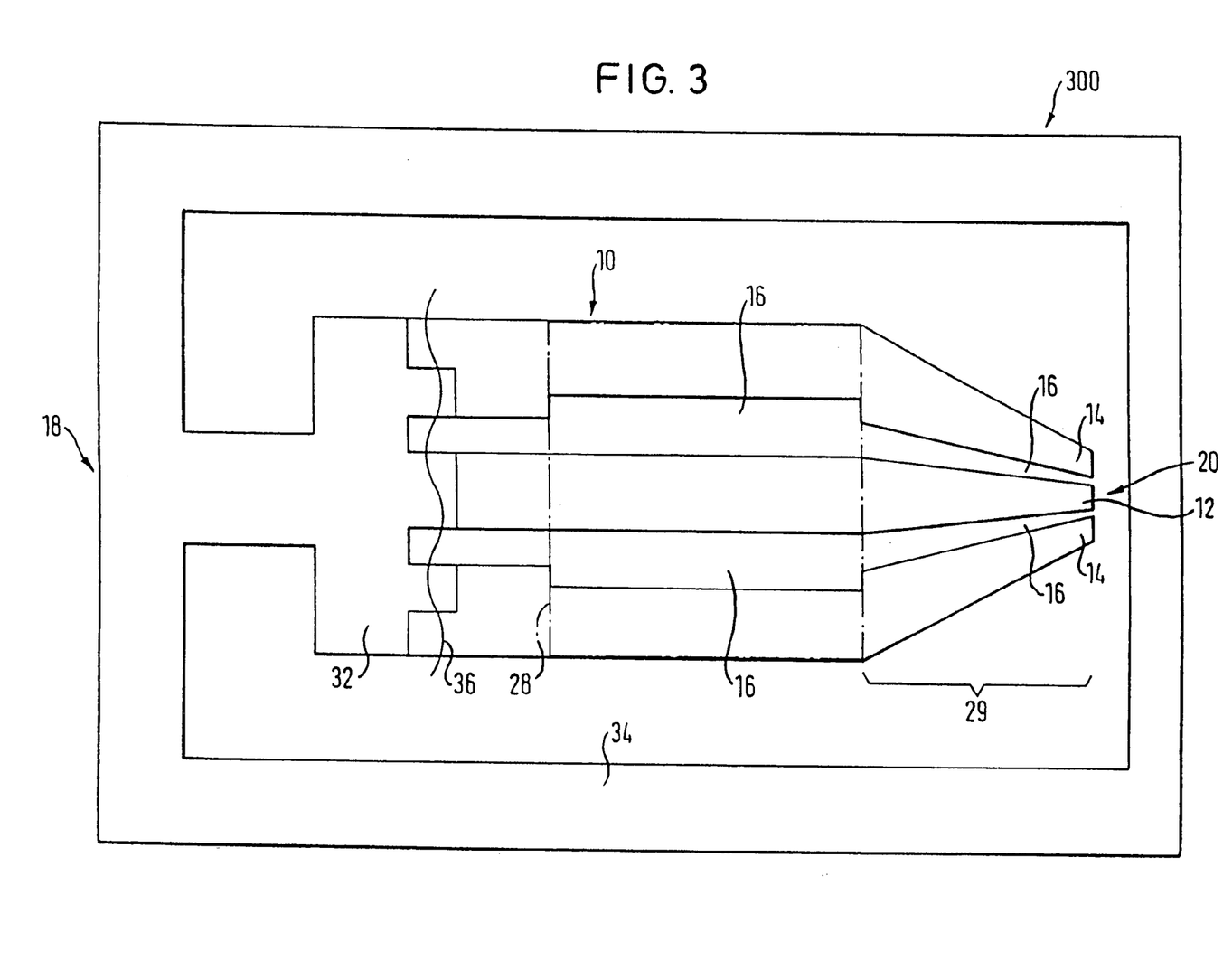
FIG. 3 is a plan view of a third preferred embodiment of measuring probe according to the invention.

The third preferred embodiment of a measuring probe 300 according to the invention, which is shown in FIG. 3, shows the state which exists after the measuring probe 300 has been produced by a method according to the invention on a silicon wafer. In FIG. 3, the same parts are once again identified by the same reference numerals, thus allowing the reader to be referred to the above description of FIGS. 1 and 2 for explanations of such parts. In the measuring probe 300 shown in FIG. 3 the conductors 12, 14 in the co-planar conductor structure 10, having been produced by a lithographic electrofabrication process which will be explained in detail below, are at first connected together mechanically by a bridge 32. Formed in one piece with bridge 32 is a frame 34 which entirely surrounds the co-planar conductor structure 10 in one plane. By means of this frame 34 it is possible for the co-planar conductor structure 10 to be manipulated as required until the measuring probe is finally completed, without the conductors 12, 14 themselves in the co-planar conductor structure 10 having to be touched, when there would be a risk of the conductors 12, 14 being damaged. Once the co-planar conductor structure 10 plus bridge 32 and frame 34 which is shown in FIG. 3 has been formed on a silicon wafer by the lithographic electrofabrication process, the arrangement 10, 32, 34 is detached from the silicon wafer and the quartz blocks 28 are fastened to the top and bottom of the co-planar conductor structure 10 in the appropriate region where the gap 16 is widened, by bonding for example. From that point on the co-planar conductor structure 10 has intrinsic strength due to the mounting by means of the quartz blocks 28 and the connection between the co-planar conductor structure 10 and the bridge 32 and frame 34 can therefore be severed. This is done in for example the region of a schematically indicated line 36. The severing of the connection between bridge 32 and the co-planar conductor structure 10 is advantageously performed in such a way that outer ends 38 of the two outer ground conductors 14 project at the co-axial cable end 18 to enable a co-axial cable for connection to the co-planar conductor structure 10 to be automatically located.

Conductors 12, 14 of the co-planar conductor structure 10 taper at the contact end 20 to give an arrangement for conductors 12, 14 which is suitably matched to contact points on an electrical circuit to be tested with which contact is to be made. To maintain a constant characteristic impedance, the gap 16 tapers accordingly in the direction of the contact end 20 in the region 29 at the contact end 20.

One particularly excellent property of the measuring probe according to the invention shown in FIGS. 1 to 3 is that the impedance set by the gaps 16 is substantially free of dispersion over the co-planar conductor structure 10, i.e. the impedance and phase velocity are substantially independent of the operating frequency.

Figure 4:
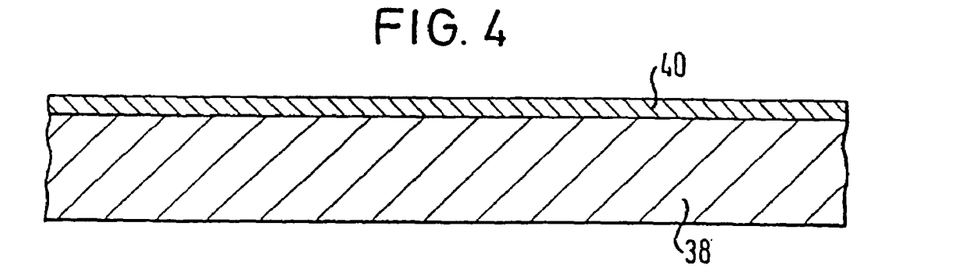
FIGS. 4 to 7 are drawings of successive steps of a method for making probes of the types illustrated in FIGS. 1–3.
Figure 5:
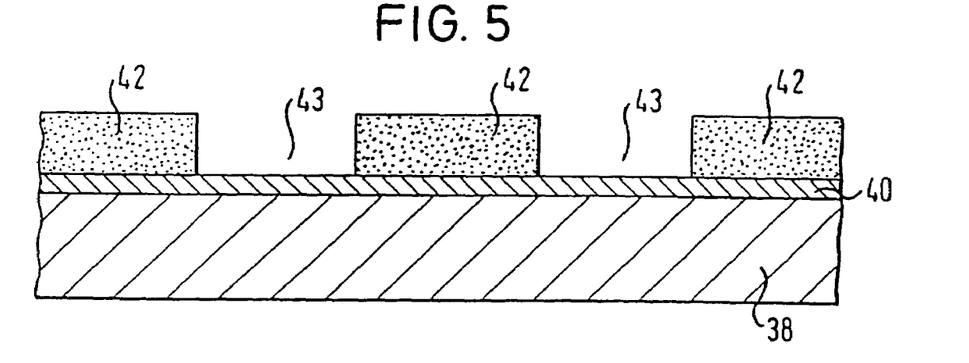
Figure 6:
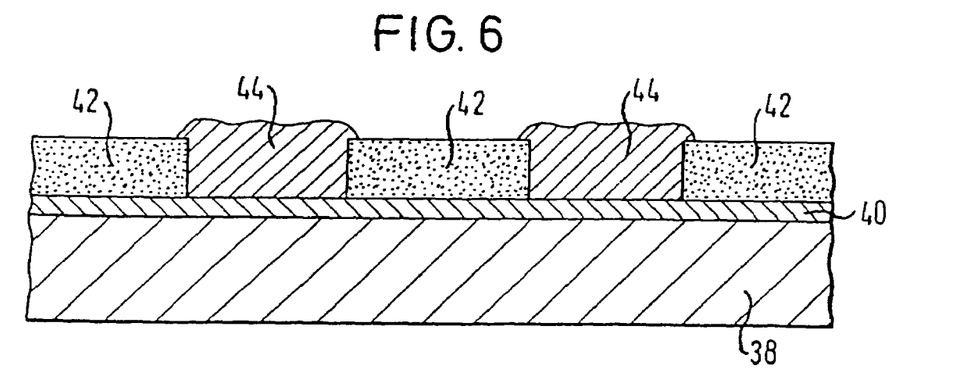
Figure 7:
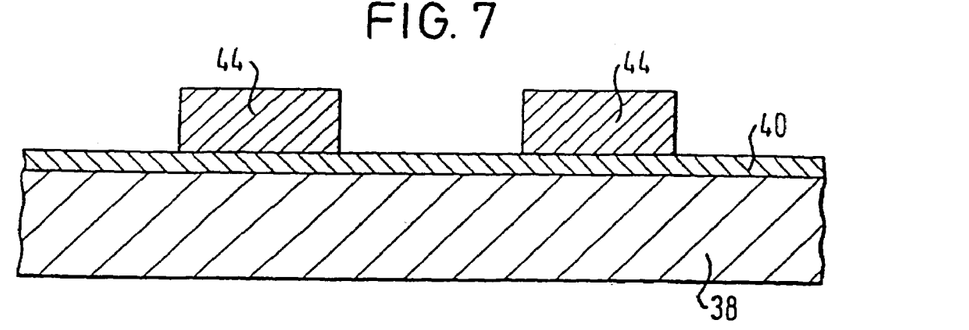

The method according to the invention of producing a measuring probe according to the invention will be explained in detail below in diagrammatic form by reference to FIGS. 4 to 7. In a first step a layer of metal 40 is vapour deposited on a silicon wafer 38 (FIG. 4). The layer of metal comprises for example titanium, silver, chromium or gold. In a further step, a light-sensitive resist 42 is applied to the layer of metal 40 as can be seen from FIG. 5. This light-sensitive resist is exposed through a mask. The mask is so designed as to match a certain number of co-planar conductor structures 10 to be produced on the silicon wafer 38 together with their respective bridges 32 and their respective frames 34, as shown in FIG. 3. If required, adjacent frames are connected together mechanically. It is particularly advantageous in this case for a large number of co-planar conductor structures 10 as shown in FIG. 3 with bridges 32 and frames 34 to be produced next to one another and one above the other on the silicon wafer. By a photolithographic process, the resist 42 is thus brought into a configuration which represents a negative of the co-planar conductor structures 10 to be produced with their respective bridges 32 and respective frames 34. To do this the resist is developed in the appropriate way. In a subsequent step, the depressions 43 which are produced in the resist as shown in FIG. 5 are filled with an electrically conductive material 44, such as nickel for example, by electroplating, as can be seen from FIG. 6. The arrangement shown in FIG. 6 is ground down and the resist 42 is removed to give an arrangement as shown in FIG. 7. The electrically conductive material 44 thus forms the desired structure for the co-planar conductor structure 10 together with an individual bridge 32 and an individual frame 34 as shown in FIG. 3. Finally the layer of metal 40, which acts as a dividing layer between the electrically conductive material 44 and the silicon wafer 38, is removed and the arrangement comprising co-planar conductor structures plus bridges and frames lying next to one another and one above the other can be detached from silicon wafer 38. Next, each individual co-planar conductor structure 10 within a frame 34 is provided on both sides with quartz blocks 28 in the appropriate region and finally the bridges 32 and frames 34 are severed from the co-planar conductor structures 10. To conclude, the co-planar conductor structure 10 is connected to a co-axial cable at the co-axial cable end 18.

Something particularly notable about the method according to the invention is that in no way is there a need for the individual conductors 12, 14 in the co-planar conductor structure 10 to be aligned in relation to one another at the time of fitting. The arrangement of conductors 12, 14 relative to one another is preset and fixed from the start of the production process to the end. This gets rid of any tolerances which might arise if the individual conductors 12, 14 were positioned mechanically during the production process.

Figure 8:
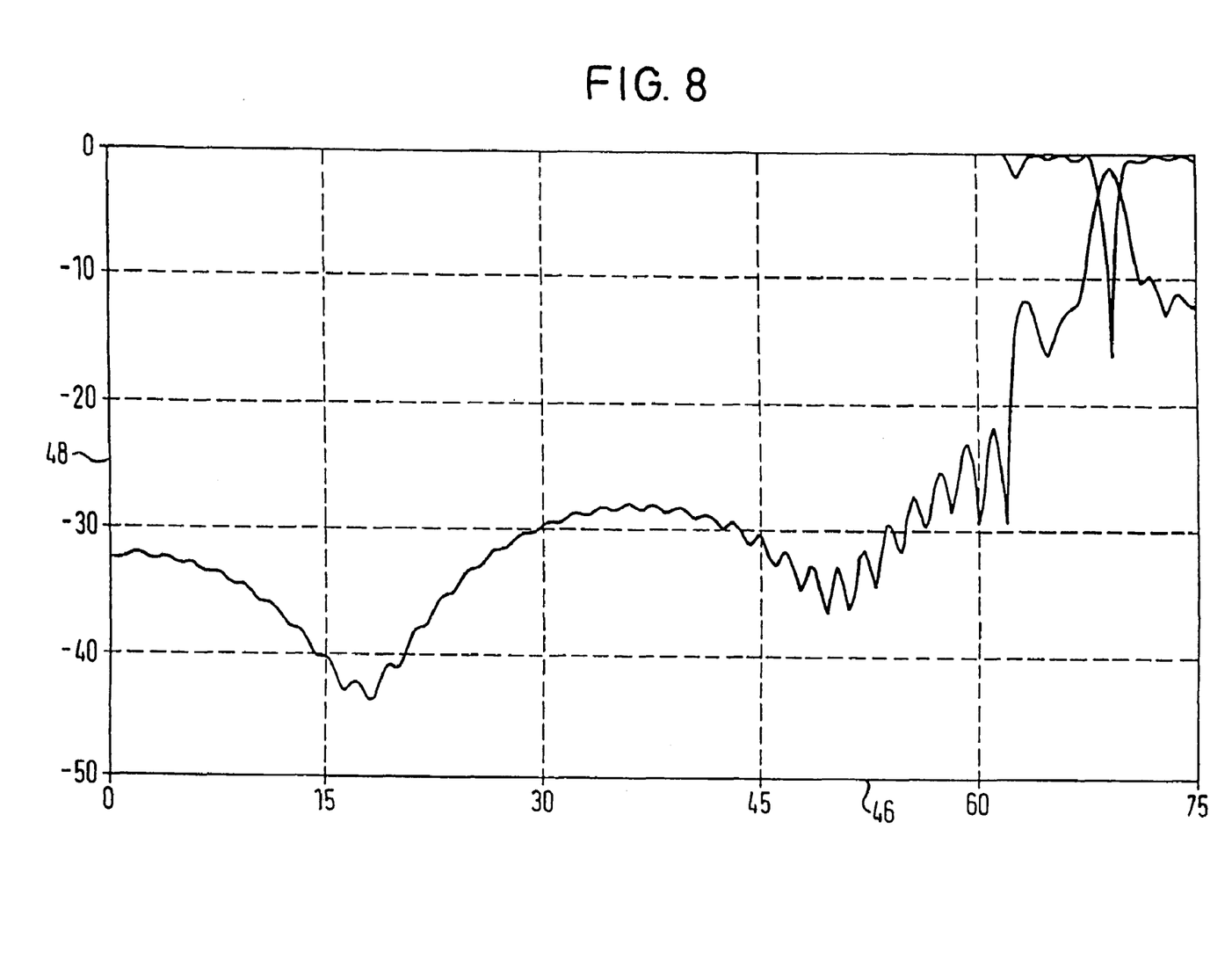
FIG. 8 is an S parameter plot from a simulation calculation for a measuring probe according to the invention.

The measuring probe according to the invention has a surprising good frequency response, as can be seen from FIG. 8. FIG. 8 shows an S parameter plot from a simulation calculation for a measuring probe according to the invention. What is plotted in this case is a frequency in GHz along the horizontal axis 46 and an S parameter in dB along the vertical axis 48. As is immediately apparent from the graph shown in FIG. 8, this model calculation shows that the measuring probe according to the invention can be used at frequencies of up to 60 GHz. And this is true with, at the same time, the possibility of its being produced in volume at low cost with a low scrap rate.

The invention claimed is:

1. Measuring probe for measuring high frequencies, comprising
    a contact end for contacting planar structures and a co-axial cable end for connection to a co-axial cable;
    a co-planar conductor structure having at least two conductors arranged between the contact end and the co-axial cable end; and
    a solid dielectric mounting the co-planar conductor structure, the dielectric being arranged on (a) the co-planar conductor structure, and (b) at least one side of the co-planar conductor structure in a central section of the probe so the dielectric is between and spaced from the co-axial cable end and the contact end, each conductor in the co-planar conductor structure including a portion formed to be individually free in space and resilient in relation to the dielectric, a respective gap being formed between each pair of conductors in the co-planar conductor structure from the co-axial cable end to the contact end in such a way that a constant characteristic impedance is obtained from the co-axial cable end to the contact end, the ground plane conductor and the signal conductor being mounted in the same plane of the solid dielectric.

2. The measuring probe of claim 1, wherein the respective gap is wider in the region where the conductor structure is mounted on the dielectric than in the portion of the co-planar conductor structure that is formed to be individually free in space and resilient in relation to the dielectric.

3. The measuring probe of claim 1, wherein the dielectric includes at least one block of quartz.

4. The measuring probe of claim 1, wherein a face of the dielectric that contacts the co-planar conductor structure includes a metal coating that is electrically connected to the co-planar conductor struck and has substantially the same shape as the co-planar conductor structure.

5. The measuring probe of claim 4, wherein the dielectric is metallised over its full area on a side thereof remote from the face of the dielectric that contacts the co-planar conductor structure.

6. The measuring probe of claim 1, wherein the dielectric is metallised over its full area on a side thereof remote from a face of the dielectric that contacts the co-planar conductor structure.

7. The measuring probe of claim 1, further including a planar circuit arranged at the co-axial cable end.

8. The measuring probe of claim 7, wherein the planar circuit includes at least one active circuit element.

9. The measuring probe of claim 1, wherein the dielectric is on both sides of the co-planar conductor structure.

10. The measuring probe of claim 9, wherein each side of the dielectric has a face that contacts the co-planar conductor structure and includes a metal coating that is electrically connected to the co-planar conductor structure and has substantially the same shape as the co-planar conductor structure.

11. The measuring probe of claim 10, wherein the dielectric is metallised over its full area on sides thereof remote from the faces of the dielectric that contact the co-planar conductor structure.

12. The measuring probe of claim 1, wherein the portion of each conductor that is free in space and resilient and the portion of each conductor mounted by the dielectric is one piece.

* * * * *